(12) United States Patent
Imken

(10) Patent No.: US 7,947,429 B2
(45) Date of Patent: May 24, 2011

(54) LONG LENGTH FLEXIBLE CIRCUITS AND METHOD OF MAKING SAME

(75) Inventor: Ronald L. Imken, Round Rock, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 626 days.

(21) Appl. No.: 11/830,666

(22) Filed: Jul. 30, 2007

(65) Prior Publication Data

US 2008/0032209 A1 Feb. 7, 2008

Related U.S. Application Data

(60) Provisional application No. 60/821,366, filed on Aug. 3, 2006.

(51) Int. Cl.
*G03F 7/22* (2006.01)

(52) U.S. Cl. ............... 430/311; 430/394; 430/5; 430/22

(58) Field of Classification Search .................. None
See application file for complete search history.

(56) References Cited

U.S. PATENT DOCUMENTS

| 5,437,946 | A | 8/1995 | McCoy |
| 5,652,645 | A | 7/1997 | Jain |
| 5,914,205 | A | 6/1999 | Theuwissen |
| 6,210,339 | B1 | 4/2001 | Kiepen et al. |
| 6,559,389 | B1 | 5/2003 | Kornrumpf et al. |
| 6,583,854 | B1 | 6/2003 | Hazama et al. |
| 6,677,088 | B2 * | 1/2004 | Magome et al. ........... 430/5 |
| 7,133,121 | B2 | 11/2006 | Bleeker et al. |
| 7,211,372 | B2 | 5/2007 | Park et al |
| 2005/0151944 | A1 | 7/2005 | Park et al. |
| 2006/0066715 | A1 | 3/2006 | Fukui |
| 2006/0076599 | A1 | 4/2006 | Goo et al. |

FOREIGN PATENT DOCUMENTS

| JP | 54121971 | 9/1979 |
| JP | 62199057 | 9/1987 |
| JP | 62199058 | 9/1987 |
| JP | 7295231 | 11/1995 |
| JP | 2004094142 | 3/2004 |
| KR | 10-2002-0063095 | 8/2002 |
| KR | 10-2005-0092848 | 9/2005 |
| KR | 10-2006-0076348 | 7/2006 |
| WO | WO 98/33096 | 7/1998 |

OTHER PUBLICATIONS

Holland, S., "Fabrication of Silicon Strip Detectors Using a Step-and-Repeat Lithography System", IEEE Transactions on Nuclear Science, vol. 39(5), p. 1259-1262, Oct. 1992.

* cited by examiner

*Primary Examiner* — Daborah Chacko-Davis
(74) *Attorney, Agent, or Firm* — Melanie G. Gover

(57) ABSTRACT

Disclosed is a method for making long flexible circuits. Some of the long circuits may be made using a single photoimaging mask. Also disclosed are flexible circuits made by this method.

13 Claims, 3 Drawing Sheets

LONG LENGTH FLEXIBLE CIRCUITS AND METHOD OF MAKING SAME

CROSS-REFERENCE TO RELATED APPLICATIONS

The present application claims priority to U.S. Provisional Patent Application 60/821,366, filed Aug. 3, 2006.

TECHNICAL FIELD

This disclosure relates to long length flexible circuits and methods of making them.

BACKGROUND

Flexible circuits are typically composed of at least one metal layer such as copper (Cu), nickel (Ni), tin (Sn), silver (Ag) or gold (Au) on a flexible polymeric film such as polyester (PET), polyimide (PI), or liquid crystal polymer (LCP). For high performance applications, the primary metal layer is commonly copper while the film layer is polyimide.

The fabrication of flexible circuits involves the creation of several layers of dielectric and conductive materials that are in intimate contact with layers adjacent to them. At least one of these layers may be patterned by selectively introducing material into or removing material from that layer. The pattern may be created by photolithographic processes. For example, a layer of photoresist material is applied onto the surface of the layer to be patterned. A phototool having transparent and opaque areas in the form of the desired pattern is used to selectively expose the photoresist to ultraviolet light. The light will either cause portions of the photoresist to undergo a crosslinking reaction in the exposed areas as in the case of a negative photoresist or will undergo reaction to break down the polymer structure in the exposed areas as is the case with a positive photoresist. The desired portion of the photoresist may be removed by an appropriate solvent. The exposed underlying area may be etched away in the case of subtractive processing or added to in the case of additive processing. In either case the layer is patterned.

Photolithographic processes enable the creation of flexible circuits having excellent feature resolution as well as allowing high throughput of the manufacturing process. If different patterns are applied to different layers, the phototool must be correctly aligned on the photoresist layer. The phototool may be secured to the photoresist by clamping or vacuum when the phototool is placed in contact with the photoresist during this photolithographic process.

SUMMARY

Some flexible circuit applications require circuits that exceed the dimensional capability of the photoimaging process. Photoimaging equipment typically has a maximum defined aperture size, e.g., 12 inch×12 inch or 18 inch×24 inch. That is, the largest single dimension which can be exposed is dictated by the size of the patterning mask used in these photoimaging tools. Some designs may require a dimension beyond this capability or require better utilization of the photoimaging area to make the circuit.

One aspect of the present invention provides a method comprising: providing a dielectric substrate having a photoresist layer; exposing a first portion of the photoresist to UV light through a photoimaging mask, and advancing the dielectric substrate and exposing a second portion of the photoresist to UV light through the photoimaging mask, wherein the second portion of the photoresist overlaps the first portion of the photoresist, wherein the photoimaging mask is patterned with aligned sections of a circuit.

Another aspect of the invention provides an article comprising: a photoimaging mask having a pattern comprising a plurality of circuit segments arranged at an angle to a major axis of the photoimaging mask.

One advantage of the present invention is the ability to produce long flexible circuits (e.g., longer than any dimension of a photoimage mask) with distinctive termination or intermediate features without having to use multiple photoimaging masks. This allows for a lower cost of producing such circuits and the ability to manufacture circuits with smaller, more precisely controlled feature sizes.

Other features and advantages of the invention will be apparent from the following drawings, detailed description, and embodiments.

DETAILED DESCRIPTION

Figure 1:
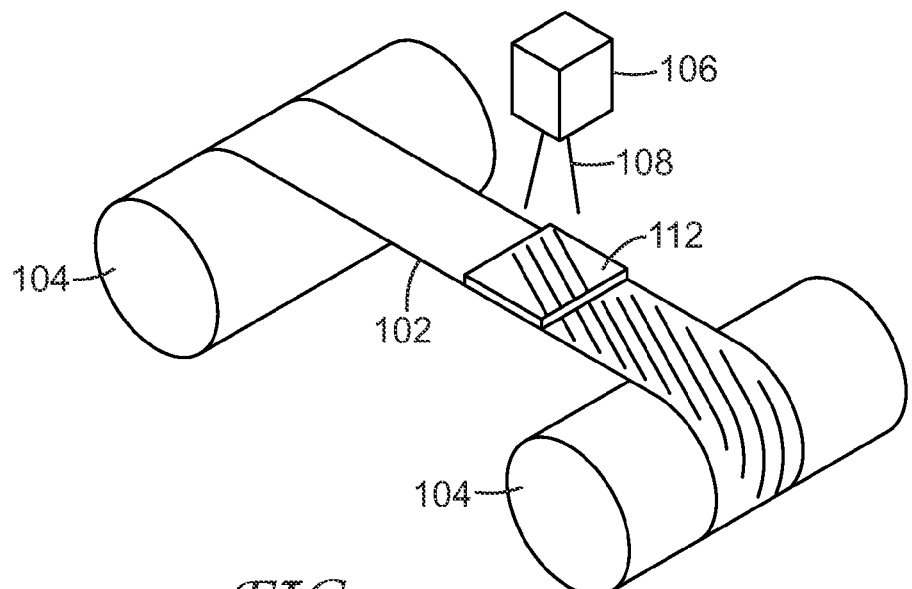
FIG. 1 shows equipment suitable for use with the present invention.

The fabrication of flexible circuits involves the creation of several layers of dielectric and conductive materials that are in intimate contact. At least one of these layers may be patterned by selectively introducing material into or removing material from that layer to form circuit traces or features in the dielectric film such as windows, vias, etc. The pattern may be created by photolithographic processes. An image of the desired pattern is created by shining UV light through a phototool having the desired pattern onto a suitable receptor material, e.g., photoresist, which is in contact with the layer to be patterned.

A phototool comprises a UV-transparent base material such as a glass, quartz, or the like with a patterned UV-opaque material such as chrome, chrome oxide, or the like on a surface of the UV-transparent base material. The UV-receptor material is typically a photoresist. For example, a layer of photoresist material is applied onto the surface of a flexible circuit layer to be patterned. The UV light that passes through the phototool is absorbed by the photoresist. The light will either cause the exposed portions of the photoresist to undergo a crosslinking reaction, as in the case of a negative photoresist, or will cause a depolymerization reaction to break down the polymer structure in the exposed areas, as is the case with a positive photoresist. The desired portion of the photoresist may then be removed by an appropriate solvent. The flexible circuits may then be processed by conventional methods, such as those described in U.S. Pat. Nos. 5,227,008; 6,177,357; or 6,403,211. For example, the exposed underlying area may be etched away in the case of subtractive processing or dielectric patterning or material may be added in the case of additive processing.

Flexible circuits are typically manufactured using additive or subtractive processes, or a combination of the two including various procedures such as metal sputtering, resist laminating, resist exposing, resist developing, etching, and plating. The sequence of such procedures may be varied as desired for the particular circuit being made.

In a suitable subtractive process, a dielectric substrate is first provided. The dielectric substrate may be a polymer film made of, for example, polyester, polyimide, liquid crystal polymer, polyvinyl chloride, acrylate, polycarbonate, or polyolefin having a thickness of about 10 μm to about 600 μm. The dielectric substrate has an optional tie layer of chrome, nickel-chrome or other conductive metal deposited onto one or both sides of the substrate, followed by deposition of the primary conductive layer (e.g., Copper, (Cu), Gold (Au), Palladium (Pd), Platinum (Pt), Silver (Ag), Tin (Sn) and alloys thereof). Optionally, the deposited conductive metal layer(s) can be plated up further to a desired thickness by known electroplating or electroless plating processes. Alternatively, a suitable laminate may be formed by adhering a metal foil to the substrate with an adhesive. The conductive metal layers can be patterned by a number of well known methods including various photolithography methods, such as UV expose with phototool, and LDI (laser direct image) or other direct imaging methods.

An aqueous or solvent-processable photoresist, either negative or positive, is then laminated or coated onto at least one side of this substrate using standard laminating or coating techniques. The photoresist is then exposed on at least one side to ultraviolet light or the like, through a mask or phototool. For a negative photoresist the exposed portions are crosslinked and the unexposed portions of the photoresist are then developed with the appropriate solvent.

Next, the exposed portions of metal and tie layers are etched away using an appropriate etchant. If desired, the dielectric film may be etched to form features in the substrate by applying, crosslinking, and developing a pattern of photoresist, then etching the portions of the dielectric substrate not covered by the crosslinked resist. This exposes certain areas of the original thin conductive metal layer or creates a clean through hole. The resist is then stripped off the circuit.

If a covercoat is desired, the next step in the process involves placing a covercoat onto at least one side of the circuit. The covercoat can be applied to one or both surfaces, either in a single step or two separate steps, using standard coating or laminating techniques. The covercoat can be used to create selective plating areas, seal the circuit, or define an exposed area by creating an opening or edge boundary.

Another possible method of forming the circuit portion would utilize semi-additive plating and the following typical step sequence:

A dielectric substrate may be coated with a tie layer. A thin first conductive layer of is deposited. The methods of deposition, materials, and thicknesses for the dielectric substrate and conductive metal layer may be as described previously.

If photolithography is used to pattern the conductive metal layer, photoresists, which may be aqueous or solvent based, and may be negative or positive photoresists, are then applied, exposed, and developed on at least one side of the metal-coated dielectric substrate using standard laminating techniques as previously described. The exposed portions of the conductive metal layer(s) may then be further plated using standard electroplating or electroless plating methods until the desired circuit thickness is achieved.

The cross-linked exposed portions of the resist are then stripped off both sides of the laminate. Subsequently, the original thin first conductive and tie layers are etched where exposed with a suitable etchant. If desired, the circuits can then be further processed as previously described.

Another possible method of forming the circuit portion would utilize a combination of subtractive and additive plating, referred to as a subtractive-additive method, and the following typical step sequence:

A dielectric substrate may be coated with an optional tie layer. A thin first conductive layer is then deposited. The methods of deposition, materials, and thicknesses for the dielectric substrate and conductive metal layer may be as described in the previous paragraphs.

If photolithography is used to pattern the conductive metal layer, an aqueous or solvent processable photoresist, either negative or positive, are then applied, exposed, and developed on at least one side of the metal-coated dielectric substrate using standard laminating techniques as previously described. When the photoresist forms a positive pattern of the desired pattern for the metal layer, the exposed portions of the metal and tie layers are etched away using a suitable etchant. The exposed (crosslinked) portion of the resist is then stripped off both sides of the laminate. If desired, the circuits can then be further processed as previously described.

In a roll-to-roll process of making a flexible circuit, some or all of the steps described above are carried out continuously as the substrate (which will include at various points in the process, metal layers, photoresist layers, and other optional layers) moves through equipment that performs a particular function. With regard to the step of exposing the photoimageable photoresist to form the desired circuit pattern, the substrate is advanced in a step and repeat manner through photoimaging equipment such as that shown in FIG. 1.

FIG. 1 shows the structure of an apparatus that may be used for performing the method of the present invention. Substrate web 102 is placed on rollers 104. Rollers 104 roll and unroll substrate web 102 so that different areas of the surface of substrate web 102 are exposed. Substrate web 102 includes at least a dielectric layer, metal layer, and a photoresist layer.

Light source 106 produces UV light 108. Mask 112 is typically a chrome-coated glass or artwork film of a fixed dimension that has a negative or positive image of the pattern of the circuit that is to be made. Mask 112 reflects or absorbs some of UV light 108 and transmits some of UV light 108 onto the photoresist layer of substrate web 102.

Substrate web 102 is positioned so that a portion of substrate web 102 is exposed to the portion of UV light 108 that is directed toward substrate web 102 by mask 112. Rollers 104 roll and unroll substrate web substrate 102 so that different portions of substrate web 102 are exposed to the patterned UV light 108 that is directed toward substrate web 102 through mask 112. Thus, the circuit pattern that is contained in mask 112 is produced in the exposed photoresist of substrate web 102. After this exposure takes place, wide web 102 is advanced so that an adjacent area of the photoresist wide web 102 may be patterned. To make a continuous circuit that is longer than the size of the pattern in mask 112, the portions of photoresist that are exposed in adjacent sections of wide web 102 are overlapped to form a continuous pattern. In addition to the circuit pattern, mask 112 may contain a fiducial mark pattern. The fiducial mark pattern allows a portion of the photoresist on substrate web 112, which is outside of the circuit pattern area, to be exposed to UV light 108.

The UV light will cause a color change or latent image feature in most dry film photoresists. When exposed to light, the dyes in these photoresists changes color, typically darkening. This color change can then be detected by an optical recognition and alignment mechanism, which is present in some photoimaging equipment such as those available under the trade designations TE 3800-03 from Toray Engineering, Japan. Alternatively, for photoimaging equipment that cannot detect color change or latent imaging, substrate web 102 can be inscribed with fiducials that are lased, punched, or etched prior to the photoimaging process. However, this approach may be less accurate than the optical alignment method in which latent image fiducials from the previous photoimaging exposure are used.

Accordingly, as substrate web 102 advances to its next position to allow an adjacent section of the photoresist on substrate web 102 to be patterned, sensor 120 senses the fiducial mark in the photoresist and aligns substrate web 102 in relation to UV light 108 to produce a continuous circuit pattern. Preferably, the use of the fiducials eliminates undesirable offset or misalignment, which could cause a discontinuity in the straight edges of the conductors.

Figure 2:
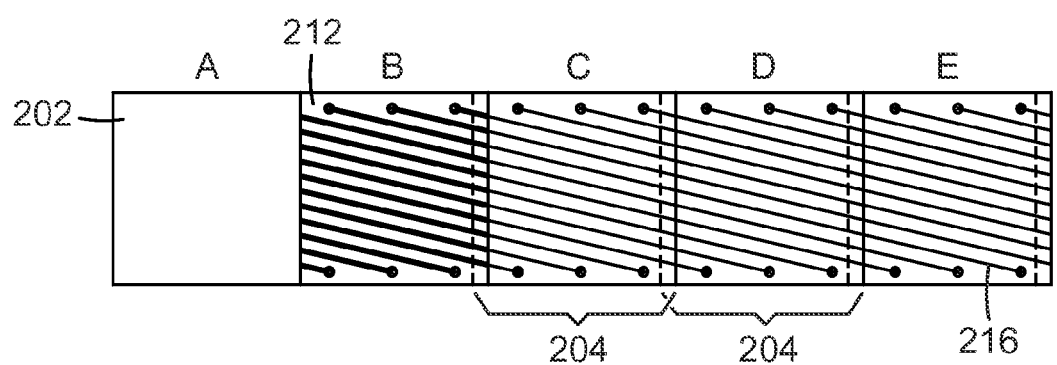
FIG. 2 illustrates a method embodiment of the present invention.

In one aspect of the invention, as shown in FIG. 2, by orienting long circuit designs at an angle relative to the down-web direction, it is possible to overlap sections 204 of a circuit to produce a long circuit composed of several adjacent sections. FIG. 2 illustrates a substrate web 202 as it moves through a photoimaging station. Segment A of FIG. 2 is the next section of substrate web 202 to be exposed to UV light through photoimaging mask 212. Segment B is covered by photoimaging mask 212 and is currently being exposed to UV light through mask 212. The photoresist on Segments C, D, and E of substrate web 202 have already been photoimaged. The length of the resulting circuit depends on the angle alpha (an example of which is identified in FIG. 4) of the circuit pattern. The angle may be from 0° to 90°. For most applications, the most suitable angle will be about 25° to about 65°. Circuit pattern 216 represents a single complete circuit pattern having distinct head and tail terminations. A complete circuit pattern in FIG. 2 crosses four sections of 204. A circuit pattern having only one or two distinct sections, e.g., head and tail terminations, a head termination and an intermediate feature, or only a tail termination, can span as many sections 204 as desired and can therefore be as long as desired. An intermediate feature may include a termination connection at a point along the length of the circuit. The length and width of the circuit will also influence the number of exposure segments as well as the range of angles that can accommodate the circuit. Although the Figures illustrate linear circuit sections arranged in parallel, the circuit sections need not be linear and the sections need not be arranged in parallel. For example, one or more circuit sections could contain curved or angular sections and the circuit sections may be arranged in any manner that allows the desired circuit to be formed.

If the circuit has features that differ from section to section, the mask can be changed such that an appropriate pattern is formed in a particular section of the photoresist on the substrate web. This may be necessary, for example, when a long circuit has distinct termination and/or intermediate features.

Because changing the masks slows production, it would be desirable to have a single mask that could be used to make long length circuits with termination and/or intermediate features. According to one aspect of the present invention, it is possible to use a single mask to provide circuits longer than the aperture size with termination features at one or both ends.

Figure 3A:
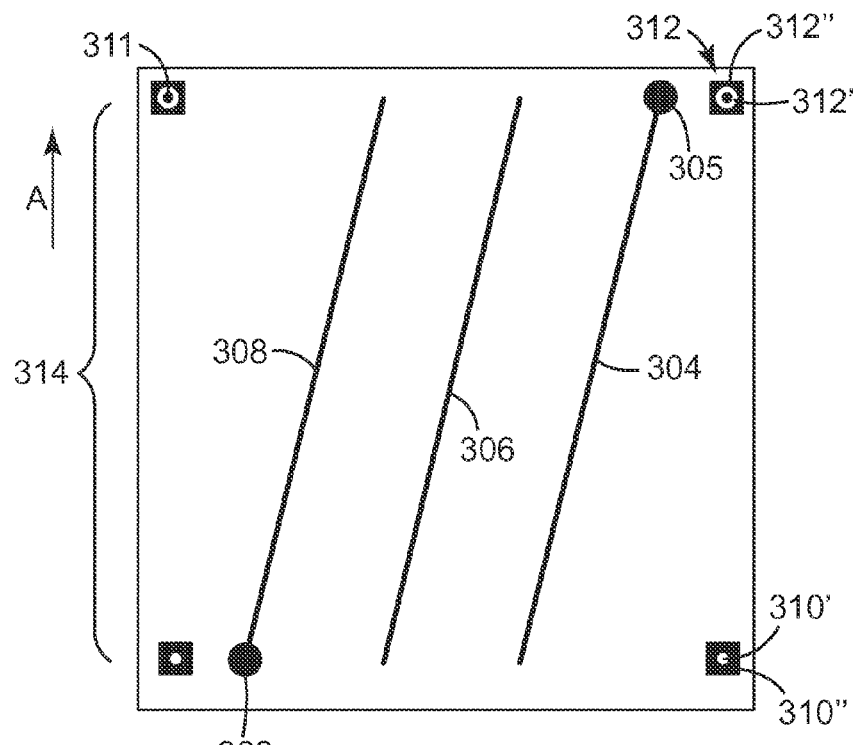
FIGS. 3A and 3B show photoimaging mask embodiments of the present invention.

FIG. 3A depicts some of the features of a photoimaging mask 112 suitable for producing a multi-step exposed circuit. FIG. 3A illustrates a photoimaging mask 112 that may be used to pattern a negative photoresist which darkens upon photo-exposure. The pattern mask is suitable for patterning photoresist on a metallized substrate that will be semi-additively plated and subsequently etched to remove the exposed portions of the original metallized surface. In FIG. 3A, the dark features represent the chrome-covered portion of the mask. The areas of photoresist under the dark features on mask 112 will not be exposed to UV light 108 and subsequently will be developed to expose the portions of the metallized substrate under these developed areas.

The circuit pattern, as shown, has three components: a head section 304 having head termination 305, a middle section 306, and a tail section 308 having tail termination 309. These sections overlap or connect when the substrate web is stepped the distance between expose fiducial 310 and alignment fiducial 312. The expose fiducial 310 is a transparent area (i.e., chrome-free) 310' surrounded by a chrome-covered area 310". Alignment fiducial 312 is a chrome-free area 312' surrounded by a chrome-covered area 312". The expose fiducial 310 is of a smaller size than the alignment fiducial 320. When an exposure takes place, the UV light darkens the photoresist in the expose fiducial 310 to form latent image 311. When the substrate web is advanced and the next section to be photoimaged is located beneath light source 106 and mask 112, latent image 311 aligns within alignment fiducial 312 in mask 112 so that it can be optically recognized through alignment fiducial 312. The transparent area that forms alignment fiducial 312 in mask 112 is larger than the transparent area that forms expose fiducial 312 in mask 112 to insure video capture of latent image 311 created by the previous photoimaging exposure. Step length 314 is the distance by which the substrate web advances between each photoimaging steps. Arrow A indicates the direction in which the substrate web advances.

Figure 3B:
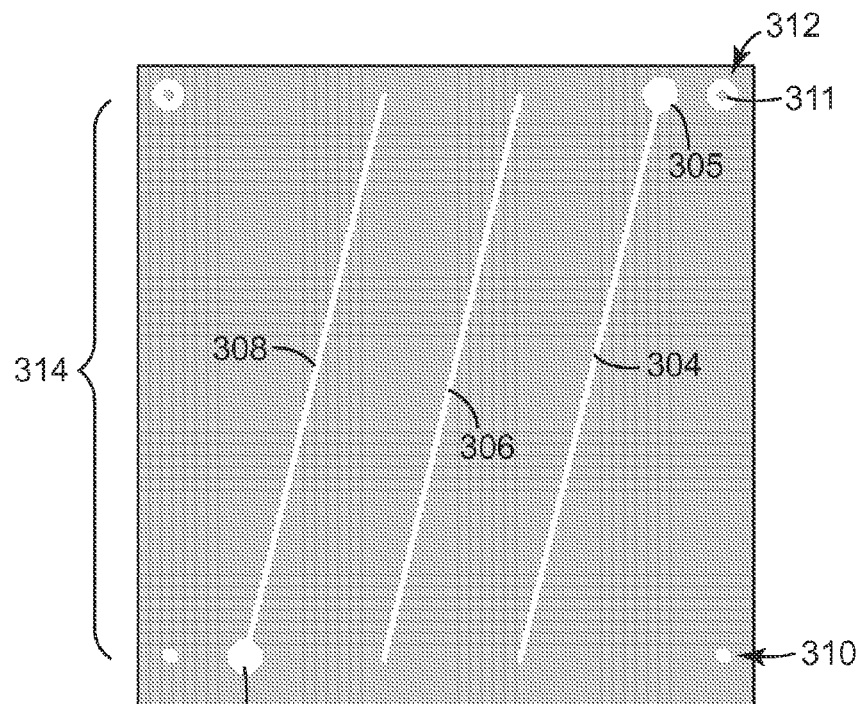

FIG. 3B illustrates an alternate embodiment of a photoimaging mask 112 that may be used to pattern a negative photoresist which darkens upon photo-exposure. The pattern mask is suitable for patterning photoresist on a metallized substrate that will be subtractively etched. In FIG. 3B, the dark features represent the chrome-covered portion of the mask. The areas of photoresist under the dark features on mask 112 will not be exposed to UV light 108 and subsequently will be developed to expose the portions of the metallized substrate under these developed areas. Expose fiducials 310 and alignment fiducials 312 have chrome-free areas 310' and 312', respectively, but do not require chrome-covered areas because the adjacent areas of mask 112 are already chrome-covered.

As an alternate to creating latent image 311, other features that can be optically recognized may be used to align the substrate web under mask 112. Suitable features include features pre-formed such as by lasing, punching, or etching features in the web prior to the photoimaging process.

It should be understood that a circuit could consist of two or more sections. Also, while the illustration shows only three circuit sections being produced per exposure (head, middle, and tail section), the mask could contain many such circuit sections (e.g., an equal number of head, middle, and tail sections). Circuits would not need to be linear (as shown).

Figure 4:
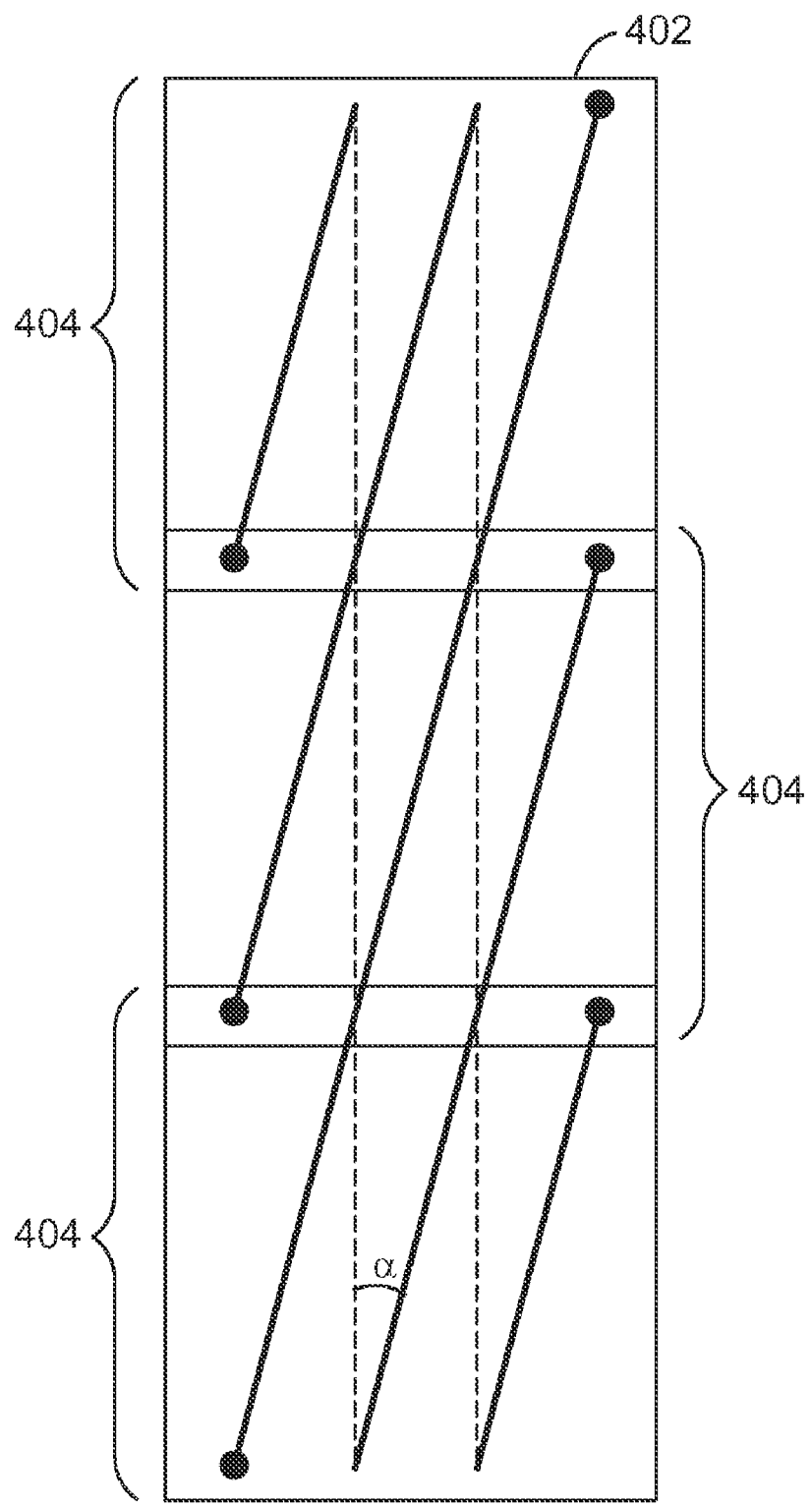
FIG. 4 illustrates a method embodiment of the present invention using the photoimaging mask of FIG. 3A.

As shown in FIG. 4, by orienting the long circuit designs at an angle such as is shown in FIG. 3A, it is possible to overlap sections of a circuit to produce a long circuit composed of three distinct segments. FIG. 4 illustrates three sections of the web 402 that have been exposed to UV light through the same photoimaging mask. The photoimaging was done to three overlapping sections 404. Because the mask is patterned to produce different segments of adjacent circuits, each circuit can be made to have distinct top, middle, and end features.

Various modifications and alterations of this invention will become apparent to those skilled in the art without departing from the scope and spirit of this invention and it should be understood that this invention is not to be unduly limited to the illustrative embodiments set forth herein.

The invention claimed is:

1. A method comprising:
    providing a dielectric substrate having a down-web direction and a cross-web direction, the dielectric layer having a photoresist layer thereon; and
    exposing a first portion of the photoresist to UV light through a first photoimaging mask, and
    advancing the dielectric substrate and exposing a second portion of the photoresist to UV light through the first or a second photoimaging mask, wherein the second portion of the photoresist overlaps the first portion of the photoresist,
    wherein the first and second photoimaging masks are patterned with different sections of at least one continuous circuit, which said circuit is longer than the length of a single one of the photoimaging masks, and
    wherein each circuit section is aligned at an angle of 0° to 90° with respect to the down-web direction.

2. The method of claim 1 further comprising advancing the dielectric substrate a second time and exposing a third portion of the photoresist to UV light through the photoimaging mask, wherein the third portion of photoresist overlaps the second portion of the photoresist.

3. The method of claim 1 wherein said each circuit section is aligned at an angle of about 25° to about 65° with respect to the down-web direction.

4. The method of claim 1 wherein at least one of said aligned section is a termination section.

5. The method of claim 4 wherein the termination section is a head section.

6. The method of claim 4 wherein the termination section is a tail section.

7. The method of claim 1 wherein at least one of said aligned section is an intermediate section.

8. The method of claim 1 wherein the first or second photoimaging mask is patterned with head and tail sections of a circuit such that a complete circuit image is formed in the photoresist after the second portion of the photoresist is exposed to UV light.

9. The method of claim 8 wherein the first or second photoimaging mask is patterned with an intermediate section such that a complete circuit image is formed in the photoresist after a third portion of the photoresist is exposed to UV light.

10. The method of claim 1 wherein the first or second photoimaging mask further comprises a fiducial pattern.

11. The method of claim 10 wherein the fiducial is formed by causing one or both of a color change or latent image formation in the photoresist.

12. The method of claim 10 wherein an optical recognition system is used to detect the latent image fiducial.

13. The method of claim 10 wherein the method of forming the fiducial is selected from the group consisting of lasing, punching, and etching.

* * * * *